United States Patent
Park et al.

(10) Patent No.: US 11,610,530 B2
(45) Date of Patent: Mar. 21, 2023

(54) GATE DRIVING CIRCUIT AND ELECTROLUMINESCENCE DISPLAY APPARATUS INCLUDING THE SAME

(71) Applicant: LG DISPLAY CO., LTD., Seoul (KR)

(72) Inventors: Yong Seok Park, Paju-si (KR); Sung Jin Lee, Paju-si (KR); Jae Yong You, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/893,908

(22) Filed: Aug. 23, 2022

(65) Prior Publication Data

US 2022/0398960 A1 Dec. 15, 2022

Related U.S. Application Data

(63) Continuation of application No. 17/459,504, filed on Aug. 27, 2021, now Pat. No. 11,450,257.

(30) Foreign Application Priority Data

Nov. 27, 2020 (KR) .................. 10-2020-0162580
Jun. 17, 2021 (KR) .................. 10-2021-0078582

(51) Int. Cl.
*G09G 3/20* (2006.01)
(52) U.S. Cl.
CPC ....... *G09G 3/20* (2013.01); *G09G 2300/0876* (2013.01); *G09G 2310/08* (2013.01); *G09G 2330/028* (2013.01)

(58) Field of Classification Search
CPC ............. G09G 3/20; G09G 2300/08; G09G 2300/0876; G09G 2310/08; G09G 2330/08
See application file for complete search history.

(56) References Cited

U.S. PATENT DOCUMENTS

| | | |
|---|---|---|
| 2010/0164915 A1 | 7/2010 | Kim et al. |
| 2010/0177082 A1 | 7/2010 | Joo et al. |
| 2016/0035262 A1 | 2/2016 | Lee et al. |
| 2018/0033363 A1* | 2/2018 | Lim ................ G09G 3/20 |
| 2018/0190201 A1 | 7/2018 | Li |
| 2019/0019471 A1 | 1/2019 | Zeng |
| 2019/0266971 A1 | 8/2019 | Hao |
| 2021/0135014 A1 | 5/2021 | Kim et al. |
| 2021/0201817 A1 | 7/2021 | Kim |

* cited by examiner

*Primary Examiner* — Gerald Johnson
(74) *Attorney, Agent, or Firm* — Polsinelli PC (57) ABSTRACT

An electroluminescence display apparatus includes a display panel including a display area including a plurality of pixel lines and a non-display area including a gate driving circuit supplying a gate signal to the plurality of pixel lines, and each of the plurality of pixel lines includes a plurality of pixels, each of the plurality of pixels includes a pixel driving circuit and a light emitting device, each of the pixel driving circuit and the gate driving circuit is implemented with a p-type transistor and an n-type transistor, and the gate driving circuit supplies a gate signal to the n-type transistor of the pixel driving circuit, so that a stably output can be provided, and the non-display area of the display panel can be reduced.

18 Claims, 7 Drawing Sheets

GATE DRIVING CIRCUIT AND ELECTROLUMINESCENCE DISPLAY APPARATUS INCLUDING THE SAME

CROSS-REFERENCE TO RELATED APPLICATIONS

This application is a continuation of U.S. patent application Ser. No. 17/459,504, filed on Aug. 27, 2021, which claims the benefit of Korean Patent Application No. 10-2020-0162580, filed on Nov. 27, 2020 and Korean Patent Application No. 10-2021-0078582 filed on Jun. 17, 2021, in the Korean Intellectual Property Office, which are hereby incorporated by reference in their entirety for all purposes as if fully set forth herein.

BACKGROUND

Field of the Disclosure

The present disclosure relates to a gate driving circuit with enhanced driving performance and an electroluminescence display apparatus including the gate driving circuit.

Description of the Background

As information technology advances, the market for display apparatuses which are connection mediums connecting a user to information is growing. Therefore, the use of various types of display apparatuses such as electroluminescence display apparatuses, liquid crystal display apparatuses, organic light emitting display apparatuses, and quantum dot display apparatuses is increasing.

The electroluminescence display apparatuses among various types of display apparatuses have a fast response time, excellent emission efficiency, and a wide viewing angle. Generally, in the electroluminescence display apparatuses, a data voltage is applied to a gate electrode of a driving transistor by using a transistor which is turned on based on a scan signal, and the data voltage supplied to the driving transistor is charged into a storage capacitor. Also, a light emitting device emits light by outputting the data voltage charged into the storage capacitor on the basis of an emission control signal. The light emitting device may include an organic light emitting device, an inorganic light emitting device, and a quantum dot device.

A gate signal and a data signal are supplied to the electroluminescence display apparatuses, and the gate signal includes a scan signal and an emission signal. The electroluminescence display apparatuses are driven by using the emission signal and one or more scan signals. Generally, a gate driving circuit for generating the scan signal may include a shift register for sequentially outputting the gate signal.

A display panel which is a minimum device for displaying an image may include a pixel array disposed therein and may be divided into a display area which displays an image and a non-display area which does not display an image. The gate driving circuit is attached on the display panel in a chip-on film (COF) type or a chip-on glass (COG) type, or is implemented as a gate-in panel (GIP) type formed by a combination of thin film transistors (TFTs) in a bezel area which is the non-display area of the display panel. A GIP type gate driving circuit includes a plurality of stages on the basis of the number of gate lines, and each of the plurality of stages outputs a gate pulse which is to be supplied to a gate line corresponding thereto. The gate line transfers the gate signal to the pixel array disposed in the display area, thereby allowing the light emitting device to emit light.

Therefore, it is required to develop a method for enhancing the driving performance and reliability of the gate driving circuit, in order to transfer an accurate signal to the pixel array.

SUMMARY

As described above, an electroluminescence display apparatus includes a pixel array and a gate driving circuit for providing one or more emission signals and scan signals to the pixel array.

Each of a plurality of pixels included in the pixel array includes a light emitting device and a pixel driving circuit which provides a driving current to the light emitting device. The pixel driving circuit may be implemented as various types for providing an accurate current to the light emitting device. A method for decreasing a leakage current of a transistor by using an n-type transistor is being researched so that the pixel driving circuit has reliability. Accordingly, a gate driving circuit for stably providing a gate single to the n-type transistor is needed.

To overcome the aforementioned problem of the related art, the present disclosure may provide a gate driving circuit for outputting a gate signal which is to be provided to an n-type transistor and an electroluminescence display apparatus including the gate driving circuit.

The present disclosure may provide a gate driving circuit for decreasing a non-display area of a display panel and an electroluminescence display apparatus including the gate driving circuit.

The present disclosure may provide a gate driving circuit for maintaining a stable output despite driving based on a low frequency and an electroluminescence display apparatus including the gate driving circuit.

To achieve these and other advantages and in accordance with the purpose of the disclosure, as embodied and broadly described herein, a gate driving circuit includes a pull-down unit controlled by a Q node to transfer a low level voltage to an output node, a pull-up unit controlled by a QB node to transfer a high level voltage of a third clock signal to the output node, a Q node controller controlled by a first clock signal to transfer a start signal to the Q node, a QB node controller controlled by the Q node to transfer a high level voltage to the QB node, and a Q node maintaining unit controlled by the Q node and a fourth clock signal, the Q node maintaining unit including a second capacitor connected to the Q node. Also, the QB node controller includes an n-type transistor and a p-type transistor connected to the Q node. Accordingly, a stable output may be provided in driving based on a low frequency.

In another aspect of the present disclosure, an electroluminescence display apparatus includes a display panel including a display area including a plurality of pixel lines and a non-display area including a gate driving circuit supplying a gate signal to the plurality of pixel lines. Also, each of the plurality of pixel lines includes a plurality of pixels, each of the plurality of pixels includes a pixel driving circuit and a light emitting device, each of the pixel driving circuit and the gate driving circuit is implemented with a p-type transistor and an n-type transistor, and the gate driving circuit supplies a gate signal to the n-type transistor of the pixel driving circuit. Accordingly, a stably output may be provided, and the non-display area of the display panel may be reduced.

BRIEF DESCRIPTION OF THE DRAWINGS

The accompanying drawings, which are included to provide a further understanding of the disclosure and are incorporated in and constitute a part of the disclosure, illustrate aspect(s) of the disclosure and together with the description serve to explain the principle of the disclosure.

In the drawings.

DETAILED DESCRIPTION

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

The shapes, sizes, ratios, angles, numbers and the like disclosed in the drawings for description of various aspects of the present disclosure to describe aspects of the present disclosure are merely exemplary and the present disclosure is not limited thereto. Like reference numerals refer to like elements throughout. Throughout this specification, the same elements are denoted by the same reference numerals. As used herein, the terms "comprise", "having," "including" and the like suggest that other parts can be added unless the term "only" is used. As used herein, the singular forms "a", "an", and "the" are intended to include the plural forms as well, unless context clearly indicates otherwise.

Elements in various aspects of the present disclosure are to be interpreted as including margins of error even without explicit statements.

In describing a position relationship, for example, when a position relation between two parts is described as "on~", "over~", "under~", and "next~", one or more other parts may be disposed between the two parts unless "just" or "direct" is used.

In describing a time relationship, for example, when the temporal order is described as "after~", "subsequent~", "next~", and "before~", a case which is not continuous may be included unless "just" or "direct" is used.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

In the specification, a gate driving circuit provided on a substrate of a display panel may be implemented with an n-type or p-type transistor. For example, a transistor may be implemented as a transistor having a metal oxide semiconductor field effect transistor (MOSFET) structure. The transistor may be a three-electrode element which includes a gate electrode, a source electrode, and a drain electrode. The source electrode may transfer a carrier to the transistor. In the transistor, a carrier may start to move from the source electrode. The drain electrode may be an electrode which enables the carrier to move to the outside of the transistor. The source electrode and the drain electrode of the transistor may not be fixed but may switch therebetween on the basis of a voltage applied thereto.

Hereinafter, a gate-on voltage may be a voltage of a gate signal for turning on a transistor, and a gate-off voltage may be a voltage for turning off the transistor.

Hereinafter, a gate driving circuit and an electroluminescence display apparatus including the same according to aspects of the present disclosure will be described in detail with reference to the accompanying drawings.

Figure 1:
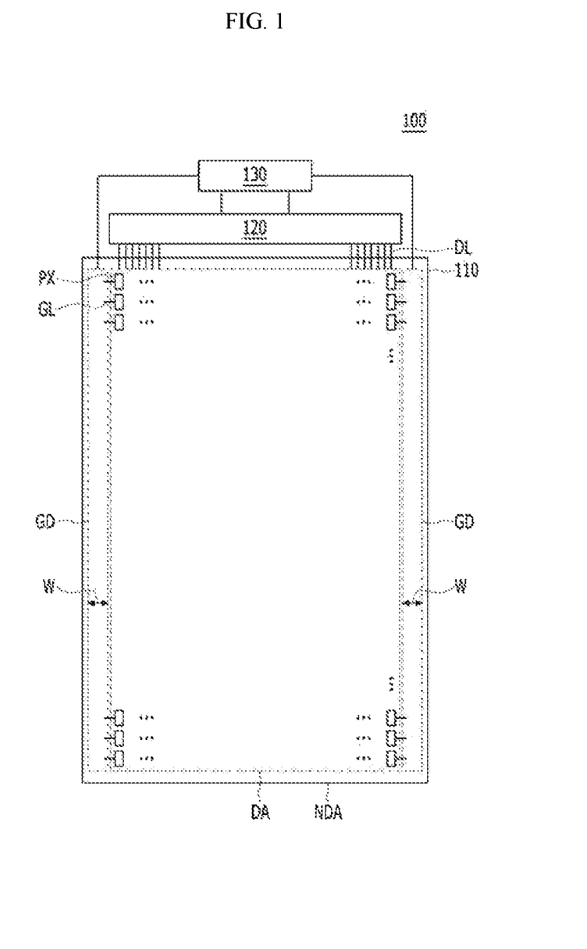
FIG. 1 is a block diagram of an electroluminescence display apparatus according to an aspect of the present disclosure.

FIG. 1 is a block diagram of an electroluminescence display apparatus 100 according to an aspect of the present disclosure.

Referring to FIG. 1, the electroluminescence display apparatus 100 according to an aspect of the present disclosure may include a display panel 110, where a plurality of data lines DL and a plurality of gate lines GL are disposed and a plurality of subpixels PX connected to the plurality of data lines DL and the plurality of gate lines GL are arranged, and a driving circuit which provides a driving signal to the display panel 110.

It is illustrated that the plurality of subpixels PX are arranged as a matrix type to configure a pixel array, but the plurality of subpixels are not limited thereto and may be arranged as various types.

The driving circuit may include a data driving circuit 120 which provides a data signal to the plurality of data lines DL, a gate driving circuit GD which provides a gate signal to the plurality of gate lines GL, and a controller 130 which controls the data driving circuit 120 and the gate driving circuit GD.

The display panel 110 may include a display area DA which displays an image and a non-display area NDA which is an area outside the display area DA. The plurality of subpixels PX may be disposed in the display area DA. The data lines DL for transferring the data signals to the plurality of subpixels PX and the gate lines GL for transferring the gate signal to the plurality of subpixels PX may be disposed in the display area DA.

The plurality of data lines DL disposed in the display area DA may extend to the non-display area NDA and may be electrically connected to the data driving circuit 120. The data line DL may electrically connect the subpixel PX to the data driving circuit 120 and may be implemented as a single line, or may be implemented by connecting a plurality of lines through a contact hole by using a link line.

The plurality of gate lines GL disposed in the display area DA may extend to the non-display area NDA and may be electrically connected to the gate driving circuit GD. The gate line GL may electrically connect the subpixel PX to the gate driving circuit GD. Additionally, a plurality of gate driving-related lines needed for the gate driving circuit GD to generate or drive gate signals may be disposed in the non-display area NDA. For example, the gate driving-related lines may include one or more high level gate voltage lines for transferring a high level gate voltage to the gate driving circuit GD, one or more low level gate voltage lines for transferring a low level gate voltage to the gate driving circuit GD, a plurality of clock lines for transferring a plurality of clock signals to the gate driving circuit GD, and one or more start lines for transferring one or more start signals to the gate driving circuit GD.

In the display panel 110, the plurality of data lines DL and the plurality of gate lines GL may be disposed in the subpixels PX. For example, the plurality of data lines DL and the plurality of gate lines GL may be arranged in rows or columns, and for convenience of description, it may be assumed that the plurality of data lines DL are arranged in columns and the plurality of gate lines GL are arranged in rows.

The controller 130 may start to perform scanning on the basis of a timing implemented in each frame and may convert input video data received from the outside on the basis of a data signal format applied to the data driving circuit 120 to generate and output image data. Also, the controller 130 may control data driving on the basis of scanning.

The controller 130 may receive the input video data and timing signals, including a vertical synchronization signal, a horizontal synchronization signal, an input data enable signal, and a clock signal, from the outside. The controller 130 which has received the timing signals may generate and output control signals for controlling the data driving circuit 120 and the gate driving circuit GD.

For example, the controller 130 may output various data control signals including a source start pulse, a source sampling clock, and a source output enable signal, for controlling the data driving circuit 120. The source start pulse may control a data sampling start timing of one or more data signal generating circuits configuring the data driving circuit 120. The source sampling clock may be a clock signal for controlling a sampling timing of data in each of the one or more data signal generating circuits. The source output enable signal may control an output timing of the data driving circuit 120.

Moreover, the controller 130 may output a gate control signal including a gate start pulse, a gate shift clock, and a gate output enable signal, for controlling the gate driving circuit GD. The gate start pulse may control an operation start timing of the one or more gate signal generating circuits configuring the gate driving circuit GD. The gate shift clock may be a clock signal which is input to the one or more gate signal generating circuits in common and may control a shift timing of a scan signal (or a gate pulse). The gate output enable signal may represent timing information about the one or more gate signal generating circuits.

The control 130 may be a timing controller used for general display apparatus technology, or may be a control device which includes a timing controller and further performs another control function.

The controller 130 may be implemented a separate element independently from the data driving circuit 120, or may be integrated with the data driving circuit 120 and thus may be implemented as one integrated circuit.

The data driving circuit 120 may be implemented to include one or more data signal generating circuits. The data signal generating circuit may include a shift register, a latch circuit, a digital-to-analog converter, and an output buffer. Depending on the case, the data signal generating circuit may further include an analog-to-digital converter.

The data signal generating circuit may be connected to a bonding pad of the display panel 110 in a tape automated bonding (TAB) type, a chip-on glass (COG) type, or a chip-on panel (COP) type, or may be directly disposed in the display panel 110 or may be integrated into and disposed in the display panel 110. Also, a plurality of data signal generating circuits may be implemented as a chip-on film (COF) type which is mounted on a source-circuit film connected to the display panel 110.

The gate driving circuit GD may sequentially supply the scan signal to the plurality of gate lines GL, and thus, may drive the subpixels PX connected to the plurality of gate lines GL. The gate driving circuit GD may include a shift register and a level shifter.

The gate driving circuit GD may be connected to the bonding pad of the display panel 110 in a TAB type, a COG type, or a COP type, or may be implemented as a GIP type or may be integrated into and disposed in the display panel 110. Also, a plurality of gate signal generating circuits may be implemented as a COF type which is mounted on a gate-circuit film connected to the display panel 110. Hereinafter, for convenience of description, an example will be described where the gate driving circuit GD includes a plurality of gate signal generating circuits and the plurality of gate signal generating circuits are implemented as a GIP type and are disposed in the non-display area NDA.

The gate driving circuit GD may sequentially supply the scan signal having a transistor turn-on voltage or a transistor turn-off voltage to the plurality of gate lines GL on the basis of control by the controller 130. When a specific gate line is enabled by the gate driving circuit GD, the data driving circuit 120 may convert image data, received from the controller 130, into analog data signals and may respectively supply the analog data signals to the plurality of data lines DL.

The data driving circuit 120 may be disposed at one side of the display panel 110. For example, the data driving circuit 120 may be disposed at an upper side, a lower side, a left side, or a right side of the display panel 110. Also, the data driving circuit 120 may be disposed at both sides of the display panel 110 on the basis of a driving manner or a panel design manner. For example, the data driving circuit 120 may be disposed at the upper and lower sides or the left and right sides of the display panel 110.

The gate driving circuit GD may be disposed at one side of the display panel 110. For example, the gate driving circuit GD may be disposed at the upper side, the lower side, the left side, or the right side of the display panel 110. Also, the gate driving circuit GD may be disposed at both sides of the display panel 110 on the basis of a driving manner or a panel design manner. For example, the gate driving circuit GD may be disposed at the upper and lower sides or the left and right sides of the display panel 110.

Hereinafter, an example will be described where the data driving circuit 120 is disposed at the upper side of the display panel 110 and the gate driving circuit GD is disposed at the left side and the right side of the display panel 110. In this case, a width W of an area occupied by the gate driving circuit GD in the display panel 110 may be referred to as a bezel. Also, as a bezel decreases, an aesthetic effect of the electroluminescence display apparatus 100 may be enhanced, and thus, it may be required to simplify the gate driving circuit GD, for reducing a bezel.

A plurality of gate lines GL disposed in the display panel 110 may include a plurality of scan lines and a plurality of emission control lines. The plurality of scan lines and the plurality of emission control lines may be lines which transfer different kinds of gate signals to gate nodes of different transistors.

Therefore, the gate driving circuit GD may include a plurality of scan driving circuits, which output scan signals to the plurality of scan lines corresponding to a kind of the gate line GL, and a plurality of emission driving circuits which output emission control signals to the plurality of emission control lines corresponding to another kind of the gate line GL.

Figure 2:
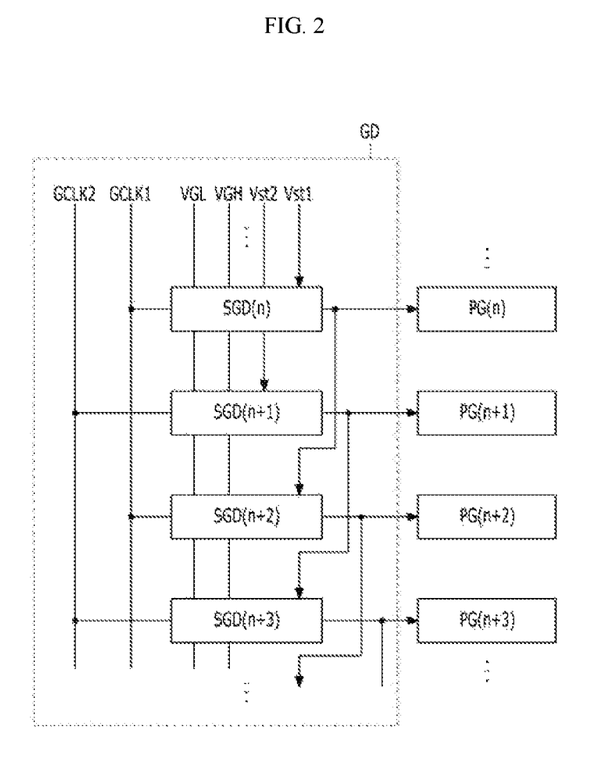
FIG. 2 is a block diagram of a gate driving circuit according to a first aspect of the present disclosure.

FIG. 2 is a block diagram of a gate driving circuit GD according to a first aspect of the present disclosure. FIG. 2 illustrates a gate driving circuit GD according to an aspect of the present disclosure and a pixel line PG to which a signal output from the gate driving circuit GD is applied.

The display area DA may include the plurality of subpixels PX and may display an image on the basis of a gray level displayed by each of the subpixels PX. As described above, for example, each of the plurality of subpixels PX may be connected to a data line DL arranged along a column line and may be connected to a gate line GL arranged along a row line (or a pixel line). In this case, subpixels PX disposed in the same row line may be referred to as a pixel line PG, and subpixels PX disposed in the same pixel line may share the same gate line GL and may be simultaneously supplied with a gate signal. Therefore, subpixels PX connected to a first gate line may be referred to as a first pixel line PG(1), and subpixels PX connected to an $n^{th}$ gate line may be referred to as an $n^{th}$ pixel line PG(n). When the number of pixel lines disposed in the display area DA is p number, first to $p^{th}$ pixel lines may be sequentially driven in synchronization with the gate signal generating circuit.

As described above, the display panel 110 may include the display area DA, which displays an image on the basis of the subpixels PX, and the non-display area NDA where a signal line, a driver, and/or the like are/is disposed and which does not display an image.

Each of the subpixels PX may include a light emitting device and a pixel driving circuit which controls the amount of current applied to the light emitting device. The pixel driving circuit may include a driving transistor which controls the amount of current so that a certain current flows in the light emitting device. The light emitting device may emit light in an emission period and may not emit light in a period other than the emission period. In a period other than the emission period, the pixel driving circuit may be initialized, the scan signal may be input to the pixel driving circuit, and a programming period and a pixel driving circuit compensation period may be executed. For example, a pixel driving circuit compensation operation may be an operation of compensating for a threshold voltage of the driving transistor. In a period other than the emission period, a current enabling the light emitting device to emit light having specific luminance may be supplied not to be constant, and thus, the light emitting device should not emit light. For example, a method of allowing the light emitting device not to emit light may connect an emission transistor to an anode of the light emitting device and the driving transistor. The emission transistor may be connected to an emission line and may be controlled by an emission signal output from an emission driver. In the emission period, the emission signal may be a turn-on voltage, and in a period other than the emission period, the emission signal may be a turn-off voltage.

The gate signal for driving the subpixels PX included in the display panel 110 may include the scan signal and the emission signal. Therefore, the gate driving circuit GD may separately include a driver for applying the scan signal and a driver for applying the emission signal. The scan signal may be applied to the pixel line PG through a scan line, and the emission signal may be applied to the pixel line PG through an emission line.

In the gate driving circuit GD of FIG. 2, only the driver for applying the scan signal is illustrated. When the number of pixel lines included in the display area DA is p number, the gate driving circuit GD according to an aspect of the present disclosure may include first to $p^{th}$ gate signal generating circuits SGD(1) to SGD(p). In FIG. 2, only $n^{th}$ to $(n+3)^{th}$ gate signal generating circuits SGD(n) to SGD(n+3) are illustrated. In this case, p and n may each be a natural number, and $1 \leq n \leq p$.

The gate driving circuit GD may include a plurality of lines for transferring a first clock signal GCLK1, a second clock signal GCLK2, a low level voltage VGL, a high level voltage VGH, a first start signal Vst1, and a second start signal Vst2. For example, the low level voltage VGL may be about −4.5 V to about −6.5 V, and the high level voltage VGH may be about 12 V to about 13 V. The $n^{th}$ gate signal generating circuit SGD(n) may provide the scan signal to the $n^{th}$ pixel line PG(n) while shifting the first start signal Vst1, based on the first clock signal GCLK1.

The first start signal Vst1 may be input to the first gate signal generating circuit SGD(1), and the second start signal Vst2 may be input to the second gate signal generating circuit SGD(2). Each of the third to $p^{th}$ gate signal generating circuits SGD(3) to SGD(p) may operate based on the scan signal which is output by a previous gate generating circuit and is received as a start signal. In detail, an $n^{th}$ output signal Vgout(n) of the $n^{th}$ gate signal generating circuit SGD(n) may be input as a start signal of the $(n+2)^{th}$ gate signal generating circuit SGD(n+2) and may be input to the $n^{th}$ pixel line PG(n).

Each of the first clock signal GCLK1 and the second clock signal GCLK2 may swing between a high level voltage and a low level voltage and may have the same period. The first clock signal GCLK1 and the second clock signal GCLK2 may have different phased. In detail, the second clock signal GCLK2 may be a signal which is obtained by shifting a phase of the first clock signal GCLK1 by 180 degrees.

In FIG. 2, it is illustrated that the first clock signal GCLK1 is input to the $n^{th}$ gate signal generating circuit SGD(n) and the $(n+2)^{th}$ gate signal generating circuit SGD(n+2) and the second clock signal GCLK2 is input to the $(n+1)^{th}$ gate signal generating circuit SGD(n+1) and the $(n+3)^{th}$ gate signal generating circuit SGD(n+3). That is, it is illustrated that the first clock signal GCLK1 is input to an odd-numbered gate signal generating circuit included in the gate driving circuit GD according to the first aspect of the present disclosure and the second clock signal GCLK2 is input to an even-numbered gate signal generating circuit included in the gate driving circuit GD according to the first aspect of the present disclosure. The first clock signal GCLK1 and the second clock signal GCLK2 may be sequentially and alternately connected to a plurality of gate signal generating circuits, but the order thereof is not limited thereto.

Figure 3:
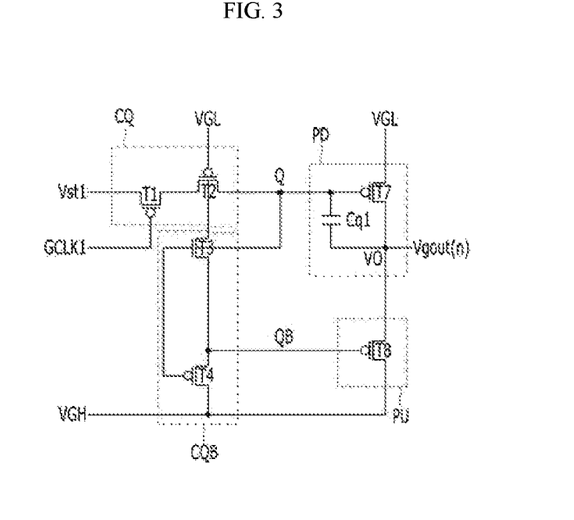
FIG. 3 is a circuit diagram of the gate driving circuit according to the first aspect of the present disclosure.

FIG. 3 is a circuit diagram of a gate signal generating circuit according to the first aspect of the present disclosure. FIG. 3 is a diagram describing an example of an $n^{th}$ gate signal generating circuit SGD(n) configuring the gate driving circuit GD.

Referring to FIG. 3, the $n^{th}$ gate signal generating circuit SGD(n) may include a pull-down unit PD, a pull-up unit PU, a Q node controller CQ, and a QB node controller CQB.

The pull-down unit PD may output an $n^{th}$ output signal Vgout(n) as a turn-off voltage in response to a voltage of a Q node, and the pull-up unit PU may output the $n^{th}$ output signal Vgout(n) as a turn-on voltage in response to a voltage of a QB node. The $n^{th}$ output signal Vgout(n) determined by the pull-down unit PD and the pull-up unit PU may be applied to an $n^{th}$ pixel line PG(n).

The Q node controller CQ may be an element for charging or discharging the Q node and may apply a first start signal Vst1 to the Q node on the basis of a first clock signal GCLK1. When n is a natural number of 3 or more, the $n^{th}$ gate signal generating circuit SGD(n) may use an $(n-2)^{th}$ output signal Vgout(n-2) of the $(n-2)^{th}$ gate signal generating circuit SGD(n-2) as the first start signal.

The QB node controller CQB may be an element for charging or discharging the QB node and may apply the turn-on voltage or the turn-off voltage to the QB node on the basis of a voltage of the Q node applied by the Q node controller CQ.

The turn-off voltage may vary based on the kind of a transistor with the turn-off voltage applied thereto. In a p-type transistor, the turn-off voltage may be a high level voltage, and in an n-type transistor, the turn-off voltage may be a low level voltage. Also, in the p-type transistor, the turn-on voltage may be a low level voltage, and in the n-type transistor, the turn-on voltage may be a high level voltage. The $n^{th}$ gate signal generating circuit SGD(n) according to an aspect of the present disclosure may include all of the n-type transistor and the p-type transistor. An $n^{th}$ output signal Vgout(n) of the $n^{th}$ gate signal generating circuit SGD(n) may be provided to a pixel driving circuit included in the $n^{th}$ pixel line PG(n). Particularly, when the pixel driving circuit is implemented with the n-type transistor and the p-type transistor, the $n^{th}$ output signal Vgout(n) may control the turn-on and turn-off of the n-type transistor, but is not limited thereto.

A detailed circuit structure and operation of the $n^{th}$ gate signal generating circuit SGD(n) will be described below in detail.

Figure 4:
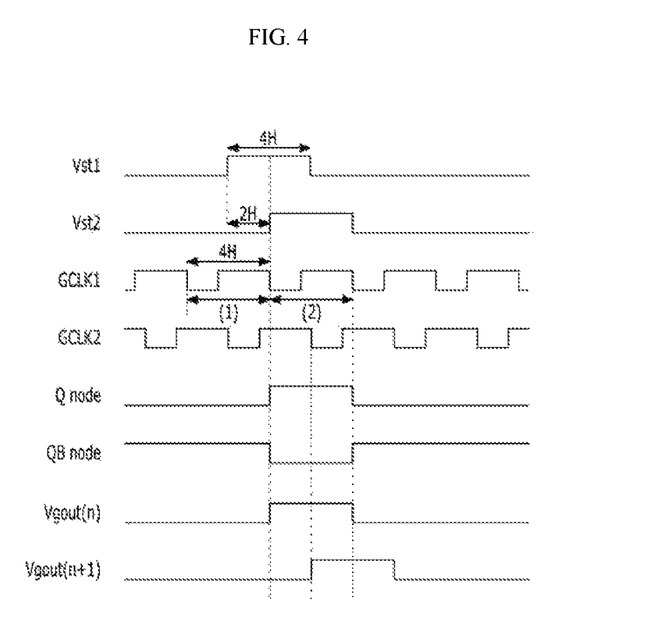
FIG. 4 is a waveform diagram of gate signals input to the gate driving circuit according to the first aspect of the present disclosure.

FIG. 4 is a waveform diagram of gate signals input to the gate signal generating circuit according to the first aspect of the present disclosure.

Referring to FIGS. 3 and 4, each of the first start signal Vst1 and the second start signal Vst2 has a high level pulse for a four-horizontal period 4H, and the second start signal Vst2 is a signal shifted by a two-horizontal period 2H from the first start signal Vst1. Each of the first clock signal GCLK1 and the second clock signal GCLK2 has a period of the four-horizontal period 4H. Each of the first clock signal GCLK1 and the second clock signal GCLK2 has a low level pulse corresponding to a shorter period than the two-horizontal period 2H and a high level pulse corresponding to a longer period than the two-horizontal period 2H. Therefore, each of the first clock signal GCLK1 and the second clock signal GCLK2 has a low level pulse which is shorter than half of a period and a high level pulse which is longer than half of the period. For example, when a time point at which a low level voltage of the first start signal Vst1 is shifted to a high level voltage overlaps with a low level pulse of the first clock signal GCLK1, a problem where an output signal is not generated may occur. In order to solve the problem, a length of a low level pulse of the first clock signal GCLK1 may be shorter than that of a high level pulse thereof. A length of a low level pulse of the second clock signal GCLK2, like the first clock signal GCLK1, may be shorter than that of a high level pulse thereof.

A high level pulse of the first start signal Vst1 applied to the $n^{th}$ gate signal generating circuit SGD(n) overlaps a high level pulse and a low level pulse of the first clock signal GCLK1.

First, a first period 1 of the first clock signal GCLK1 which starts before a high level pulse of the second start signal Vst2 is input to the $n^{th}$ gate signal generating circuit SGD(n) will be described.

The Q node controller CQ may be implemented with a first transistor T1 and a second transistor T2. The first transistor T1 and the second transistor T2 may be connected to each other in series and may each be implemented as a p-type transistor. The first transistor T1 may be controlled by the first clock signal GCLK1 and may provide the first start signal Vst1 to the second transistor T2. Also, the second transistor T2 may be controlled by a low level voltage VGL and may provide the Q node with the first start signal Vst1 transferred from the first transistor T1. The second transistor T2 may always maintain a turn-on state on the basis of the low level voltage VGL. The second transistor T2 may be connected between the Q node and the first transistor T1 and may buffer a voltage of the Q node. The first period 1 of the first clock signal GCLK1 may start with a low level voltage of the first clock signal GCLK1, and the first start signal Vst1 may have a low level voltage. Accordingly, the Q node controller CQ may provide a low level voltage to the Q node.

In a low level pulse period of the first clock signal GCLK1, the first start signal Vst1 provided to the Q node may have a low level voltage, and the low level voltage may be provided to the pull-down unit PD. The pull-down unit PD may be implemented with a seventh transistor T7 and a first capacitor Cq1. The seventh transistor T7 may be implemented as a p-type transistor. The seventh transistor T7 may be controlled by the Q node and may output the low level voltage VGL. The first capacitor Cq1 may be connected to a gate node of the seventh transistor T7 and an output node VO which outputs an $n^{th}$ output signal Vgout(n). The first capacitor Cq1 may bootstrap the voltage of the Q node so as to drop, and thus, may enable the $n^{th}$ output signal Vgout(n) to maintain the low level voltage VGL and may maintain a low level voltage of the Q node after the low level voltage VGL of the $n^{th}$ output signal Vgout(n) is output.

The Q node may control the QB node controller CQB. The QB node controller CQB may be implemented with a third transistor T3 and a fourth transistor T4. The third transistor T3 and the fourth transistor T4 may be connected to each other in series and may all be controlled by the Q node. The third transistor T3 may be implemented as an n-type transistor and the fourth transistor T4 may be implemented as a p-type transistor, and thus, in the same period, the turn-off/on state of the third transistor T3 may be opposite to the turn-off/on state of the fourth transistor T4. Therefore, the third transistor T3 may be turned off by a low level voltage of the Q node, and the fourth transistor T4 may be turned on by the low level voltage of the Q node. A high level voltage VGH may be provided to the QB node by the turned-on fourth transistor T4. Because the third transistor T3 is implemented as the n-type transistor, a connection of a circuit may be simplified, and thus, a width W of the gate driving circuit GD may decrease. Also, an active layer of the n-type transistor may include oxide, and thus, a threshold voltage margin of the third transistor T3 may be secured and a voltage provided to the third transistor T3 may be normally transferred thereto.

During a low level pulse period of the first clock signal GCLK1, the high level voltage VGH provided to the QB node may be provided to the pull-up unit PU. The pull-up unit PU may be implemented with an eighth transistor T8. Also, the eighth transistor T8 may be implemented as a p-type transistor. The eighth transistor T8 may be controlled and turned off by the QB node.

Subsequently, during the first period 1 of the first clock signal GCLK1, the first clock signal GCLK1 may be shifted from a low level voltage to a high level voltage, and the first start signal Vst1 may be shifted from a low level voltage to a high level voltage. The first clock signal GCLK1 having a high level voltage may turn off the first transistor T1.

The second transistor T2 may be connected between the first transistor T1 and the Q node and the first transistor T1 may be turned off, and thus, the Q node may be floated but may not be largely shaken. Also, a voltage of the Q node and the $n^{th}$ output signal Vgout(n) may be maintained as the low level voltage VGL by the first capacitor Cq1.

Therefore, during the first period 1 of the first clock signal GCLK1, an output signal Vgout(n) of the $n^{th}$ gate signal generating circuit SGD(n) may be the low level voltage VGL.

Second, a second period 2 of the first clock signal GCLK1 will be described. The second period 2 of the first clock signal GCLK1 may start based on a low level voltage, and the first start signal Vst1 may be in a state corresponding to a high level voltage.

The first transistor T1 may be controlled by the first clock signal GCLK1 and may provide the first start signal Vst1 to the second transistor T2. Also, the second transistor T2 may be controlled by the low level voltage VGL and may provide the Q node with the first start signal Vst1 transferred from the first transistor T1. That is, the Q node controller CQ may provide a high level voltage to the Q node.

In a low level pulse period of the first clock signal GCLK1, the first start signal Vst1 provided to the Q node may be a high level voltage, and the high level voltage may be provided to the pull-down unit PD. Accordingly, the seventh transistor T7 may be controlled and turned off by the Q node.

Moreover, the Q node may be controlled by the QB node controller CQB, and thus, the third transistor T3 may be turned on by a high level voltage of the Q node and the fourth transistor T4 may be turned off by the high level voltage of the Q node. The turn-on third transistor T3 may provide the low level voltage VGL to the QB node.

During the low level pulse period of the first clock signal GCLK1, the low level voltage VGL provided to the QB node may be provided to the pull-up unit PU. The eighth transistor T8 may be turned on by the QB node and may output the high level voltage VGH to the output node VO.

Subsequently, during the second period 2 of the first clock signal GCLK1, the first clock signal GCLK1 may be shifted from a low level voltage to a high level voltage, and the first start signal Vst1 may be shifted from a high level voltage to a low level voltage. A time at which a low level voltage of the first clock signal GCLK1 is shifted to a high level voltage and a time at which a high level voltage of the first start signal Vst1 is shifted to a low level voltage may have a slight difference therebetween. The first clock signal GCLK1 having a high level voltage may turn off the first transistor T1. The Q node may maintain a high level voltage, and the QB node may maintain a low level voltage.

Therefore, during the second period 2 of the first clock signal GCLK1, the $n^{th}$ output signal Vgout(n) of the $n^{th}$ gate signal generating circuit SGD(n) may be the high level voltage VGH. The $n^{th}$ output signal Vgout(n) having the high level voltage VGH may be maintained during the four-horizontal period 4H and may be provided to an $n^{th}$ pixel line to turn on an n-type transistor.

Figure 5:
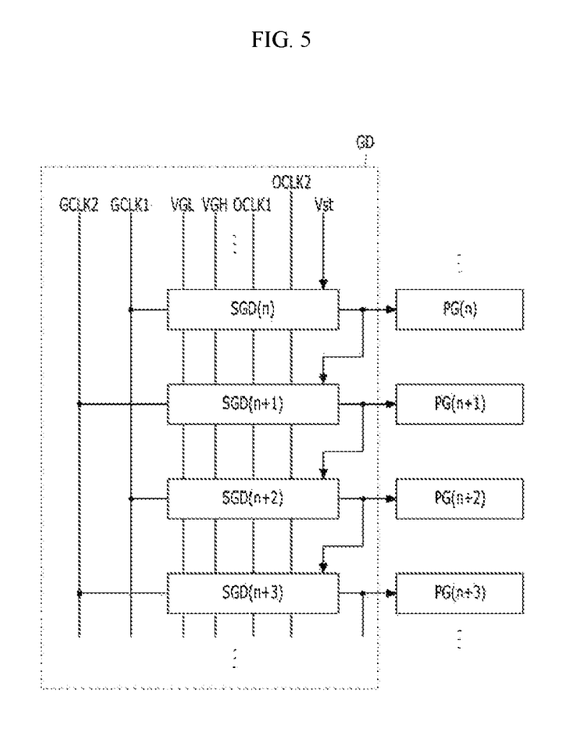
FIG. 5 is a block diagram of a gate driving circuit according to a second aspect of the present disclosure.

FIG. 5 is a block diagram of a gate driving circuit GD according to a second aspect of the present disclosure. In detail, FIG. 5 illustrates the gate driving circuit GD according to an aspect of the present disclosure and a pixel line PG to which a signal output from the gate driving circuit GD is applied.

Hereinafter, in describing the second aspect, descriptions of elements which are the same as or similar to those of the first aspect may be omitted.

In FIG. 5, like FIG. 2, the gate driving circuit GD may include only a driver for applying a scan signal. When the number of pixel lines included in the display area DA is p number, the gate driving circuit GD according to an aspect of the present disclosure may include first to $p^{th}$ gate signal generating circuits SGD(1) to SGD(p). In FIG. 5, only $n^{th}$ to $(n+3)^{th}$ gate signal generating circuits SGD(n) to SGD(n+3) are illustrated. In this case, p and n may each be a natural number, and 1≤n≤p.

The gate driving circuit GD may include a plurality of lines for transferring a first clock signal GCLK1, a second clock signal GCLK2, a low level voltage VGL, a high level voltage VGH, a third clock signal OCLK1, a fourth clock signal OCLK2, and a start signal Vst. The $n^{th}$ gate signal generating circuit SGD(n) may provide the scan signal to an $n^{th}$ pixel line PG(n) while shifting the start signal Vst, based on the first clock signal GCLK1.

The start signal Vst may be input to the first gate signal generating circuit SGD(1), and each of the second to $p^{th}$ gate signal generating circuits SGD(2) to SGD(p) may operate based on the scan signal which is output by a previous gate generating circuit and is received as a start signal. In detail, an $n^{th}$ output signal Vgout(n) of the $n^{th}$ gate signal generating circuit SGD(n) may be input as a start signal of the $(n+1)^{th}$ gate signal generating circuit SGD(n+1) and may be input to the $n^{th}$ pixel line PG(n).

Each of the first clock signal GCLK1 and the second clock signal GCLK2 may swing between a high level voltage and a low level voltage and may have the same period. The first clock signal GCLK1 and the second clock signal GCLK2 may have different phased. In detail, the second clock signal GCLK2 may be a signal which is obtained by shifting a phase of the first clock signal GCLK1 by 180 degrees.

In FIG. 5, it is illustrated that the first clock signal GCLK1 is input to the $n^{th}$ gate signal generating circuit SGD(n) and the $(n+2)^{th}$ gate signal generating circuit SGD(n+2) and the second clock signal GCLK2 is input to the $(n+1)^{th}$ gate signal generating circuit SGD(n+1) and the $(n+3)^{th}$ gate signal generating circuit SGD(n+3). That is, it is illustrated that the first clock signal GCLK1 is input to an odd-numbered gate signal generating circuit included in the gate driving circuit GD according to the second aspect of the present disclosure and the second clock signal GCLK2 is input to an even-numbered gate signal generating circuit included in the gate driving circuit GD according to the second aspect of the present disclosure. The first clock signal GCLK1 and the second clock signal GCLK2 may be sequentially and alternately connected to a plurality of gate signal generating circuits, but the order thereof is not limited thereto.

Each of the third clock signal OCLK1 and the fourth clock signal OCLK2 may swing between a high level voltage and a low level voltage and may have the same period. The third clock signal OCLK1 and the fourth clock signal OCLK2 may have different phased. In detail, the fourth clock signal OCLK2 may be a signal which is obtained by shifting a phase of the third clock signal OCLK1 by 180 degrees.

Figure 6:
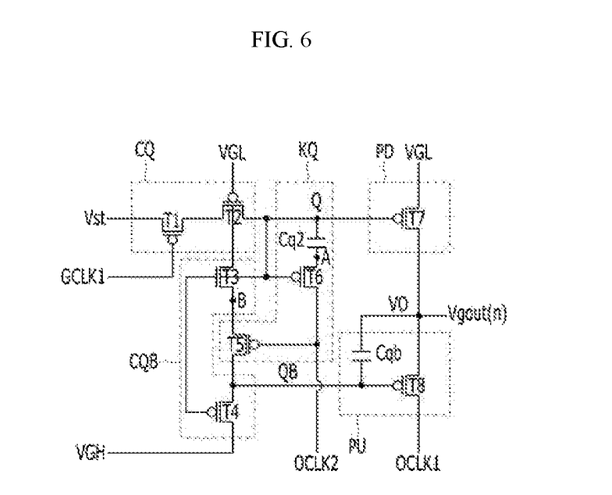
FIG. 6 is a circuit diagram of the gate driving circuit according to the second aspect of the present disclosure.

FIG. 6 is a circuit diagram of a gate signal generating circuit according to the second aspect of the present disclosure. FIG. 6 is a diagram describing an example of an $n^{th}$ gate signal generating circuit SGD(n) configuring the gate driving circuit GD.

Referring to FIG. 6, the $n^{th}$ gate signal generating circuit SGD(n) may include a pull-down unit PD, a pull-up unit PU, a Q node controller CQ, a QB node controller CQB, and a Q node maintaining unit KQ.

The pull-down unit PD may output an $n^{th}$ output signal Vgout(n) as a turn-off voltage in response to a voltage of a Q node, and the pull-up unit PU may output the $n^{th}$ output signal Vgout(n) as a turn-on voltage in response to a voltage of a QB node. The $n^{th}$ output signal Vgout(n) determined by the pull-down unit PD and the pull-up unit PU may be applied to an $n^{th}$ pixel line PG(n).

The Q node controller CQ may be an element for charging or discharging the Q node and may apply the turn-on voltage or the turn-off voltage to the Q node on the basis of the start signal Vst. The start signal Vst may be input to the first gate signal generating circuit SGD1, and the second gate signal generating circuit SGD2 and gate signal generating circuits subsequent thereto may use a previous output signal as a start signal. When n is a natural number of 2 or more, the $n^{th}$ gate signal generating circuit SGD(n) may use an $(n-1)^{th}$ output signal Vgout(n-1) of the $(n-1)^{th}$ gate signal generating circuit SGD(n-1) as a start signal.

The QB node controller CQB may be an element for charging or discharging the QB node and may apply the turn-on voltage or the turn-off voltage to the QB node on the basis of a voltage of the Q node applied by the Q node controller CQ.

The electroluminescence display apparatus 100 according to an aspect of the present disclosure may vary a frequency and may be driven based on the varied frequency, in order to decrease power consumption. For example, the electroluminescence display apparatus 100 may be driven at a low frequency of about 1 Hz in a period where a still image, a picture, and/or a text, instead of a moving image, are/is displayed. In driving based on a low frequency, because power consumption is reduced but the moving of a screen is slow, a slight variation of luminance may be recognized as flickering, and thus, an output signal of the gate driving circuit GD should be maintained to be constant. The Q node maintaining unit KQ included in the gate signal generating circuit according to the second aspect of the present disclosure may enable the Q node to maintain a voltage for turning on the pull-down unit PD when an output signal of the gate signal generating circuit is the low level voltage VGL.

The $n^{th}$ gate signal generating circuit SGD(n) according to the second aspect of the present disclosure may include all of an n-type transistor and a p-type transistor. An $n^{th}$ output signal Vgout(n) of the $n^{th}$ gate signal generating circuit SGD(n) may be provided to a pixel driving circuit included in an $n^{th}$ pixel line PG(n), and particularly, may control the turn-on and turn-off of the n-type transistor, but is not limited thereto.

A detailed circuit structure and operation of the $n^{th}$ gate signal generating circuit SGD(n) will be described below.

Figure 7:
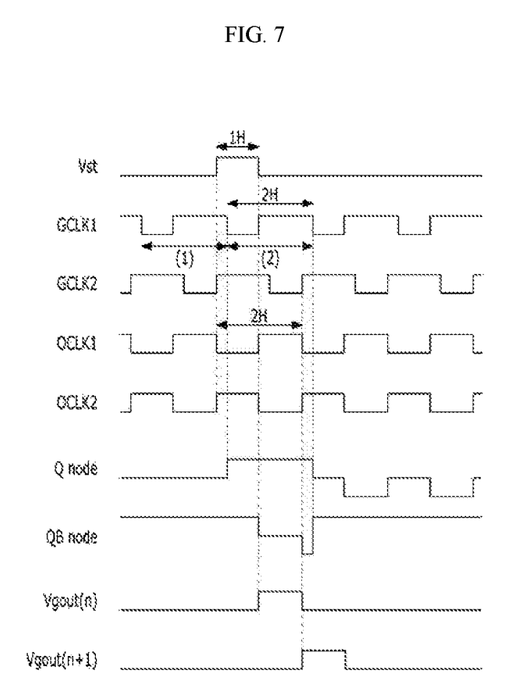
FIG. 7 is a waveform diagram of gate signals input to the gate driving circuit according to the second aspect of the present disclosure.

FIG. 7 is a waveform diagram of gate signals input to the gate signal generating circuit according to the second aspect of the present disclosure.

Referring to FIGS. 6 and 7, the start signal Vst has a high level pulse of a one-horizontal period 1H. Each of the first clock signal GCLK1 and the second clock signal GCLK2 has a period of a two-horizontal period 2H. Each of the first clock signal GCLK1 and the second clock signal GCLK2 has a low level pulse corresponding to a shorter period than the one-horizontal period 1H and a high level pulse corresponding to a longer period than the one-horizontal period 1H. Therefore, each of the first clock signal GCLK1 and the second clock signal GCLK2 has a low level pulse which is shorter than half of a period and a high level pulse which is longer than half of the period. For example, when a time point at which a low level voltage of the start signal Vst is shifted to a high level voltage overlaps a low level pulse of the first clock signal GCLK1, a problem where an output signal is not generated may occur. In order to solve the problem, a length of a low level pulse of the first clock signal GCLK1 may be shorter than that of a high level pulse thereof. A length of a low level pulse of the second clock signal GCLK2, like the first clock signal GCLK1, may be shorter than that of a high level pulse thereof.

Each of the third clock signal OCLK1 and the fourth clock signal OCLK2 may have a period of the two-horizontal period 2H. Each of the third clock signal OCLK1 and the fourth clock signal OCLK2 has a low level pulse and a high level pulse of the one-horizontal period 1H. Referring to FIG. 6, unlike the first clock signal GCLK1, each of the third clock signal OCLK1 and the fourth clock signal OCLK2 is a signal connected to an output unit, and thus, does not affect the generating of the output signal. Accordingly, a low level pulse and a high level pulse of each of the third clock signal OCLK1 and the fourth clock signal OCLK2 may be implemented to have the same length.

A high level pulse of the start signal Vst applied to the $n^{th}$ gate signal generating circuit SGD(n) overlaps a low level pulse of the first clock signal GCLK1.

First, a first period 1 of the first clock signal GCLK1 which starts before the start signal Vst is input to the $n^{th}$ gate signal generating circuit SGD(n) will be described.

The Q node controller CQ may be implemented with a first transistor T1 and a second transistor T2. The first transistor T1 and the second transistor T2 may be serially connected to each other and may be implemented as a p-type transistor. The first transistor T1 may be controlled by the first clock signal GCLK1 and may provide the start signal Vst to the second transistor T2. Also, the second transistor T2 may be controlled by a low level voltage VGL and may provide the Q node with the start signal Vst transferred from the first transistor T1. The second transistor T2 may always maintain a turn-on state on the basis of the low level voltage VGL. The first period 1 of the first clock signal GCLK1 may start based on a low level voltage of the first clock signal GCLK1, and the start signal Vst may be a low level voltage. Accordingly, the Q node controller CQ may provide a low level voltage to the Q node.

In a low level pulse period of the first clock signal GCLK1, the start pulse Vst provided to the Q node may have a low level voltage, and the low level voltage may be provided to the pull-down unit PD. The pull-down unit PD may be implemented with a seventh transistor T7. The seventh transistor T7 may be implemented as a p-type transistor. The seventh transistor T7 may be controlled by the Q node and may output the low level voltage VGL.

Moreover, the Q node may control the QB node controller CQB. The QB node controller CQB may be implemented with a third transistor T3 and a fourth transistor T4. The third transistor T3 and the fourth transistor T4 may be serially connected to each other and may be controlled by the Q node. The third transistor T3 may be implemented as an n-type transistor and the fourth transistor T4 may be implemented as a p-type transistor, and thus, in the same period, the turn-off/on state of the third transistor T3 may be opposite to the turn-off/on state of the fourth transistor T4. Therefore, the third transistor T3 may be turned off by a low level voltage of the Q node, and the fourth transistor T4 may be turned on by the low level voltage of the Q node. A high level voltage VGH may be provided to the QB node by the turned-on fourth transistor T4. Because the third transistor T3 is implemented as the n-type transistor, a connection of a circuit may be simplified, and thus, a width W of the gate driving circuit GD may decrease. Also, an active layer of the n-type transistor may include oxide, and thus, a threshold voltage margin of the third transistor T3 may be secured and a voltage provided to the third transistor T3 may be normally transferred thereto.

During a low level pulse period of the first clock signal GCLK1, the high level voltage VGH provided to the QB node may be provided to the pull-up unit PU. The pull-up unit PU may be implemented with an eighth transistor T8 and a third capacitor Cqb. The eighth transistor T8 may be implemented as a p-type transistor. The third capacitor Cqb may be connected to an output node VO and the QB node and may be charged with the low level voltage VGL of the output node VO and the high level voltage VGH of the QB node. The eighth transistor T8 may be controlled and turned off by the QB node.

Moreover, the Q node and the fourth clock signal OCLK2 may control a Q node maintaining unit KQ. The Q node maintaining unit KQ may be implemented with a fifth transistor T5, a sixth transistor T6, and a second capacitor Cq2. The fifth transistor T5 and the sixth transistor T6 may each be implemented as a p-type transistor. The fifth transistor T5 may be turned on by a low level voltage of the fourth clock signal OCLK2, and the sixth transistor T6 may be turned on by a low level voltage of the Q node and may provide a low level voltage of the fourth clock signal OCLK2 to an A node. The second capacitor Cq2 may be connected to the A node and the Q node and may be charged with a voltage provided to each of the A node and the Q node.

Subsequently, during the first period 1 of the first clock signal GCLK1, the first clock signal GCLK1 may be shifted from a low level voltage to a high level voltage and may turn off the first transistor T1.

The second transistor T2 may be connected between the first transistor T1 and the Q node and the first transistor T1 may be turned off, and thus, the Q node may be floated but a voltage of the Q node may be maintained as a low level voltage by the Q node maintaining unit KQ. The seventh transistor T7 may maintain a turn-on state, and the $n^{th}$ output signal Vgout(n) may be maintained as the low level voltage VGL.

Therefore, during the first period 1 of the first clock signal GCLK1, an output signal Vgout(n) of the $n^{th}$ gate signal generating circuit SGD(n) may maintain the low level voltage VGL. In driving based on a low frequency, the electroluminescence display apparatus 100 according to an aspect of the present disclosure may maintain a constant voltage of the Q node through the Q node maintaining unit KQ, and thus, the $n^{th}$ gate signal generating circuit SGD(n) may be stably driven.

Second, a second period 2 of the first clock signal GCLK1 will be described. The second period 2 of the first clock signal GCLK1 may start based on a low level voltage, and the start signal Vst may be shifted from a low level voltage to a high level voltage before the first period 1 of the first clock signal GCLK1 ends and may be in a state corresponding to a high level voltage.

The first transistor T1 may be controlled by the first clock signal GCLK1 and may provide the start signal Vst to the second transistor T2. Also, the second transistor T2 may be controlled by the low level voltage VGL and may provide the Q node with the start signal Vst transferred from the first transistor T1. That is, the Q node controller CQ may provide a high level voltage to the Q node.

In a low level pulse period of the first clock signal GCLK1, the start signal Vst provided to the Q node may be a high level voltage, and the high level voltage may be provided to the pull-down unit PD. Accordingly, the seventh transistor T7 may be controlled and turned off by the Q node.

Moreover, the Q node may be controlled by the QB node controller QB, and thus, the third transistor T3 may be turned on by a high level voltage of the Q node and may provide the low level voltage VGL to a B node. Also, the fourth transistor T4 may be turned off by the high level voltage of the Q node and may cut off the high level voltage VGH provided to the QB node.

Moreover, the fifth transistor T5 may be turned off by a high level voltage of the fourth clock signal OCLK2 and may cut off the B node and the QB node, and the sixth transistor T6 may be turned off by a high level voltage of the Q node.

During the low level pulse period of the first clock signal GCLK1, by using a third capacitor Cqb of the pull-up unit PU, the QB node may maintain the high level voltage VGH and may maintain the turn-off state of the eighth transistor T8.

Subsequently, during the second period 2 of the first clock signal GCLK1, the first clock signal GCLK1 may be shifted from a low level voltage to a high level voltage, and the start signal Vst may be shifted from a high level voltage to a low level voltage. The first clock signal GCLK1 having a high level voltage may turn off the first transistor T1. However, a high level voltage of the Q node may be maintained by the Q node maintaining unit KQ.

The third transistor T3 of the QB node controller CQB may be turned on by a high level voltage of the Q node and may apply the low level voltage VGL to the B node, and the fourth transistor T4 may be turned off by the high level voltage of the Q node.

The fifth transistor T5 of the Q node maintaining unit KQ may be turned on by a low level voltage of the fourth clock signal OCLK2 and may transfer the low level voltage VGL of the B node to the QB node. The sixth transistor T6 may be turned off by the high level voltage of the Q node. Also, a voltage of the Q node may be maintained by the second capacitor Cq2.

The low level voltage VGL transferred to the QB node may control the pull-up unit PU. In detail, the eighth transistor T8 may be turned on by the low level voltage VGL of the QB node and may output a high level voltage of the third clock signal OCLK1 as an $n^{th}$ output signal Vgout(n). The $n^{th}$ output signal Vgout(n) may maintain a high level voltage during a one-horizontal period 1H where the third clock signal OCLK1 maintains a high level voltage.

Moreover, before the second period 2 of the first clock signal GCLK1, the third clock signal OCLK1 may be shifted from a high level voltage to a low level voltage, and the fourth clock signal OCLK2 may be shifted from a low level voltage to a high level voltage. In this case, the fifth transistor T5 may be turned off by the fourth clock signal OCLK2, but may not affect a voltage of the Q node. Also, a low level voltage of the third clock signal OCLK1 may be transferred to an output node VO through the turned-on eighth transistor T8, and thus, a voltage variation of the output node VO may affect the QB node on the basis of a coupling effect of the third capacitor Cqb. A voltage of the QB node may decrease by a difference between a high level voltage and a low level voltage of the third clock signal OCLK1, and simultaneously, a falling time of a voltage of the output node VO may be reduced.

Therefore, during the second period 2 of the first clock signal GCLK1, the $n^{th}$ output signal Vgout(n) of the $n^{th}$ gate signal generating circuit SGD(n) may output the high level voltage VGH corresponding to the one-horizontal period 1H. In this case, the third capacitor Cqb may be disposed in the pull-up unit PU, and thus, the $n^{th}$ gate signal generating circuit SGD(n) may decrease a falling time of the $n^{th}$ output signal Vgout(n) and may enhance the reliability of an output signal.

Figure 8:
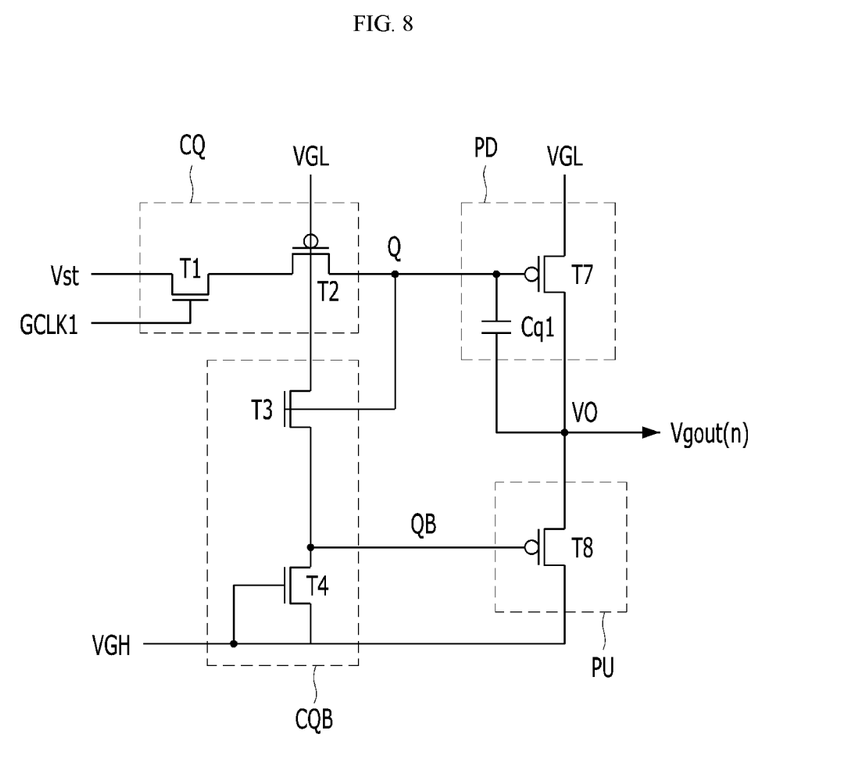
FIG. 8 is a circuit diagram of a gate driving circuit according to a third aspect of the present disclosure.

FIG. 8 is a circuit diagram of a gate driving circuit according to a third aspect of the present disclosure. FIG. 8 is a diagram describing an example of an $n^{th}$ gate signal generating circuit SGD(n) configuring the gate driving circuit GD.

Hereinafter, in describing the third aspect, descriptions of elements which are the same as or similar to those of the first aspect may be omitted. Also, the third aspect may be applied to the block diagram of the gate driving circuit GD of FIG. 2.

Referring to FIG. 8, the $n^{th}$ gate signal generating circuit SGD(n) may include a pull-down unit PD, a pull-up unit PU, a Q node controller CQ, and a QB node controller CQB.

The pull-down unit PD may output an $n^{th}$ output signal Vgout(n) as a turn-off voltage in response to a voltage of a Q node, and the pull-up unit PU may output the $n^{th}$ output signal Vgout(n) as a turn-on voltage in response to a voltage of a QB node. The pull-down unit PD and the pull-up unit PU may be serially connected to each other and may share an output node VO. The $n^{th}$ output signal Vgout(n) determined by the pull-down unit PD and the pull-up unit PU may be applied to an $n^{th}$ pixel line PG(n).

The Q node controller CQ may be an element for charging or discharging the Q node and may apply a start signal Vst to the Q node on the basis of a first clock signal GCLK1. When n is a natural number of 3 or more, the $n^{th}$ gate signal generating circuit SGD(n) may use an $(n-2)^{th}$ output signal Vgout(n-2) of the $(n-2)^{th}$ gate signal generating circuit SGD(n-2) as the start signal.

The QB node controller CQB may be an element for charging or discharging the QB node and may apply the turn-on voltage or the turn-off voltage to the QB node on the basis of a voltage of the Q node applied by the Q node controller CQ.

The $n^{th}$ gate signal generating circuit SGD(n) according to an aspect of the present disclosure may include all of an n-type transistor and a p-type transistor. An $n^{th}$ output signal Vgout(n) of the $n^{th}$ gate signal generating circuit SGD(n) may be provided to a pixel driving circuit included in the $n^{th}$ pixel line PG(n). Particularly, when the pixel driving circuit is implemented with the n-type transistor and the p-type transistor, the $n^{th}$ output signal Vgout(n) may control the turn-on and turn-off of the n-type transistor, but is not limited thereto.

A detailed circuit structure and operation of the $n^{th}$ gate signal generating circuit SGD(n) according to the third aspect of the present disclosure will be described below in detail.

Figure 9:
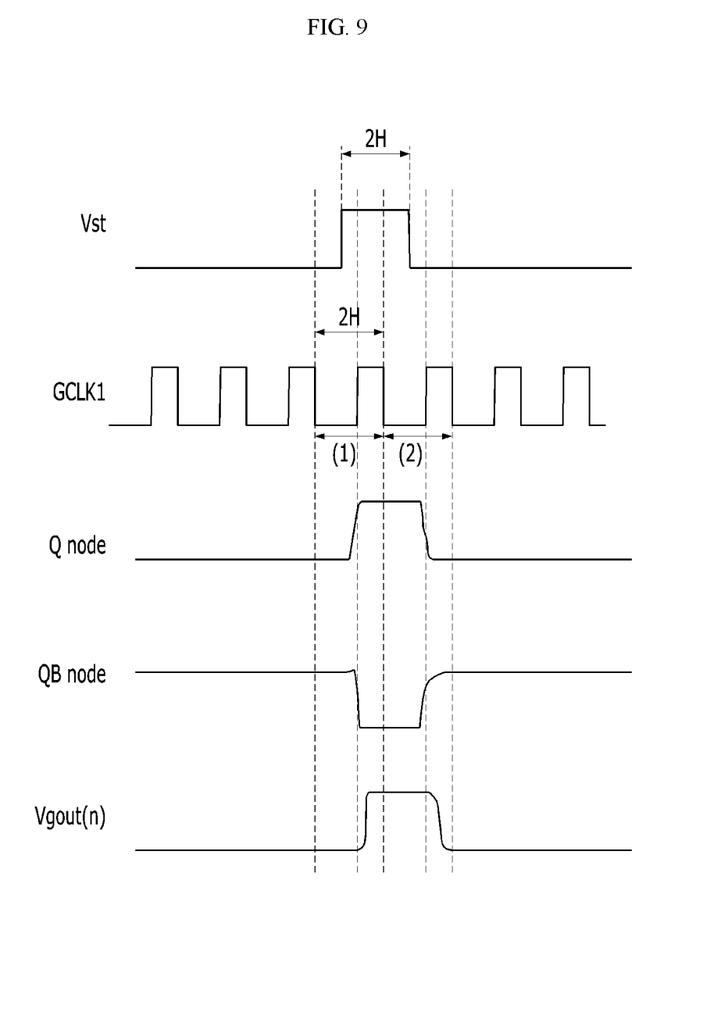
FIG. 9 is a waveform diagram of gate signals input to the gate driving circuit according to the third aspect of the present disclosure.

FIG. 9 is a waveform diagram of gate signals input to the gate driving circuit according to the third aspect of the present disclosure.

Referring to FIGS. 8 and 9, each of the start signal Vst has a high level pulse of a two-horizontal period 2H. The first clock signal GCLK1 has a high level pulse corresponding to a shorter period than the one-horizontal period 1H and a low level pulse corresponding to a longer period than the one-horizontal period 1H. For example, when a time at which a low level voltage of the start signal Vst is shifted to a high level voltage overlaps a high level pulse of the first clock signal GCLK1, a problem where an output signal is not generated may occur. In order to solve the problem, a length of a high level pulse of the first clock signal GCLK1 may be shorter than that of a low level pulse thereof.

A high level pulse of the start signal Vst applied to the $n^{th}$ gate signal generating circuit SGD(n) overlaps a high level pulse and a low level pulse of the first clock signal GCLK1.

First, a first period 1 of the first clock signal GCLK1 which starts before the first start signal Vst1 is input to the $n^{th}$ gate signal generating circuit SGD(n) will be described.

The Q node controller CQ may be implemented with a first transistor T1 and a second transistor T2. The first transistor T1 and the second transistor T2 may be connected to each other in series, the first transistor T1 may be implemented as an n-type transistor, and the second transistor T2 may be implemented as a p-type transistor. The first transistor T1 may be controlled by the first clock signal GCLK1 and may provide the start signal Vst to the second transistor T2. Also, the second transistor T2 may be controlled by a low level voltage VGL and may provide the Q node with the start signal Vst transferred from the first transistor T1. The second transistor T2 may always maintain a turn-on state on the basis of the low level voltage VGL. The second transistor T2 may be connected between the Q node and the first transistor T1 and may buffer a voltage of the Q node.

The first period 1 of the first clock signal GCLK1 may start with a low level voltage of the first clock signal GCLK1, and the start pulse Vst may have a low level voltage. Subsequently, while the first clock signal GCLK1 has a low level voltage, the start signal Vst may be shifted to a high level voltage. While the first clock signal GCLK1 has a low level voltage, the first transistor T1 may be in a turn-off state.

When the first clock signal GCLK1 has a high level voltage in the first period 1 of the first clock signal GCLK1, the start signal Vst may maintain a high level voltage.

The first transistor T1 may be turned on by a high level pulse of the first clock signal GCLK1, and thus, the Q node controller CQ may provide a high level voltage of the start signal Vst to the Q node.

In a high level pulse period of the first clock signal GCLK1, the start signal Vst provided to the Q node may have a high level voltage, and the high level voltage may be provided to the pull-down unit PD. The pull-down unit PD may be implemented with a seventh transistor T7 and a first capacitor Cq1, which are connected to a line supplied with a low level voltage VGL. The seventh transistor T7 may be implemented as a p-type transistor, and thus, the seventh transistor T7 may be turned off by a high level voltage of the Q node.

The Q node may control the QB node controller CQB. The QB node controller CQB may be implemented with a third transistor T3 and a fourth transistor T4. The third transistor T3 and the fourth transistor T4 may be serially connected to each other through the QB node, and each of the third transistor T3 and the fourth transistor T4 may be implemented as an n-type transistor. A gate electrode of the third transistor T3 may be connected to the Q node, a first electrode thereof may be connected to a line supplied with the low level voltage VGL, and a second electrode thereof may be connected to the QB node. A gate electrode and a first electrode of the fourth transistor T4 may be connected to a line supplied with a high level voltage VGH to form a diode contact, and a second electrode thereof may be connected to the QB node. Therefore, the third transistor T3 may be controlled by the Q node, and the fourth transistor T4 may be controlled by the high level voltage VGH. The fourth transistor T4 may always maintain a turn-on state on the basis of the high level voltage VGH, and thus, may fundamentally maintain a state of the QB node as the high level voltage VGH. In this case, the third transistor T3 may be turned on by a high level voltage of the Q node and may provide the low level voltage VGL to the QB node.

During a high level pulse period of the first clock signal GCLK1, the low level voltage GVL provided to the QB node may be provided to the pull-up unit PU. The pull-up PU may be implemented with an eighth transistor T8 connected to a line supplied with the high level voltage VGH. Also, the eighth transistor T8 may be implemented as a p-type transistor. The eighth transistor T8 may be turned on by the low level voltage VGL provided to the QB node and may provide the high level voltage VGH as the $n^{th}$ output signal Vgout(n). Therefore, during a low level pulse period of the first clock signal GCLK1 in the first period 1 of the first clock signal GCLK1, an output signal Vgout(n) of the $n^{th}$ gate signal generating circuit SGD(n) may be the low level voltage VGL, and during a high level pulse period of the first clock signal GCLK1, the output signal Vgout(n) of the $n^{th}$ gate signal generating circuit SGD(n) may be the high level voltage VGH.

Second, a second period 2 of the first clock signal GCLK1 will be described. The second period 2 of the first clock signal GCLK1 may start based on a low level voltage, and the start signal Vst may start based on a high level voltage. While the first clock signal GCLK1 has a low level voltage, the start signal Vst may be shifted from a high level voltage to a low level voltage.

In a low level pulse period of the first clock signal GCLK1, the first transistor T1 may be turned off, and the Q node may maintain a high level voltage. The second transistor T2 may be connected between the first transistor T1 and the Q node and the first transistor T1 may be turned off, and thus, the Q node may be floated but a voltage of the Q node may not be largely shaken by the second transistor T2. A high level voltage may maintain the seventh transistor T7 in a turn-off state.

Moreover, the Q node may be controlled by the QB node controller CQB, and thus, the third transistor T3 may maintain a turn-on state on the basis of a high level voltage of the Q node and may provide the low level voltage VGL to the QB node.

During the low level pulse period of the first clock signal GCLK1, the low level voltage VGL provided to the QB node may be provided to the pull-up unit PU. The eighth transistor T8 may be turned on by the QB node and may output the high level voltage VGH to the output node VO. The output node VO may be a node which is shared by the pull-down unit PD and the pull-up unit PU serially connected to each other and may be a node to which the output signal Vgout(n) is supplied.

Subsequently, during the second period 2 of the first clock signal GCLK1, the first clock signal GCLK1 may be shifted from a low level voltage to a high level voltage, and the start signal Vst may be a high level voltage. A time at which a low level voltage of the first clock signal GCLK1 is shifted to a high level voltage may be later than a time at which a high level voltage of the first start signal Vst1 is shifted to a low level voltage.

The first clock signal GCLK1 having a high level voltage may turn on the first transistor T1. The Q node controller CQ may transfer a low level voltage of the start signal Vst to the Q node. The Q node may control the pull-down unit PD, and thus, the seventh transistor T7 may output the low level voltage VGL on the basis of the Q node. The first capacitor Cq1 may include a first node connected to the Q node and a second node connected to the output node VO to which the $n^{th}$ output signal Vgout(n) is output. The first capacitor Cq1 may bootstrap a voltage of the Q node so as to drop, and thus, may enable the $n^{th}$ output signal Vgout(n) to maintain the low level voltage VGL and may maintain a low level voltage of the Q node after the low level voltage VGL of the $n^{th}$ output signal Vgout(n) is output.

Moreover, the third transistor T3 may be turned off by a low level voltage of the Q node, and the QB node may be shifted to the high level voltage VGH by the fourth transistor T4.

Therefore, during the second period 2 of the first clock signal GCLK1, the output signal Vgout(n) of the $n^{th}$ gate signal generating circuit SGD(n) may maintain the high level voltage VGH and then may be shifted to the low level voltage VGL. The output signal Vgout(n) having the high level voltage VGH may be maintained during the two-horizontal period 2H and may be provided to an $n^{th}$ pixel line to turn on an n-type transistor. However, the present disclosure is not limited thereto and may be connected to the p-type transistor to turn off the p-type transistor.

The $n^{th}$ gate signal generating circuit SGD(n) may include the first transistor T1, the third transistor T3, and the fourth transistor T4 implemented as an n-type transistor and may form a diode contact by using the fourth transistor T4, and thus, a connection of a circuit may be simplified, thereby decreasing a width W of gate driving circuit GD. Also, an active layer of the n-type transistor may include oxide, and thus, a leakage current of the first transistor T1 and the third transistor T3 may decrease and a threshold voltage margin may be secured, thereby normally transferring a voltage to each transistor.

A gate driving circuit and an electroluminescence display apparatus according to an aspect of the present disclosure will be described below.

In a gate driving circuit according to an aspect of the present disclosure, the gate driving circuit includes a pull-down unit controlled by a Q node to transfer a low level voltage to an output node, a pull-up unit controlled by a QB node to transfer a high level voltage of a third clock signal to the output node, a Q node controller controlled by a first clock signal to transfer a start signal to the Q node, a QB node controller controlled by the Q node to transfer a high level voltage to the QB node, and a Q node maintaining unit controlled by the Q node and a fourth clock signal, the Q node maintaining unit including a second capacitor connected to the Q node. Also, the QB node controller includes an n-type transistor and a p-type transistor connected to the Q node. Accordingly, a stable output may be provided in driving based on a low frequency.

According to another feature of the present disclosure, the pull-down unit and the pull-up unit may be connected to the output node, the pull-up unit may include a third capacitor, and the third capacitor may be connected to the output node and the QB node.

According to another feature of the present disclosure, the start signal may have a high level voltage at a period corresponding to a one-horizontal period.

According to another feature of the present disclosure, the third clock signal and the fourth clock signal may have a 180-degree phase difference therebetween at a period corresponding to a two-horizontal period.

According to another feature of the present disclosure, a high level voltage of the third clock signal transferred to the output node through the pull-up unit may be synchronized with the third clock signal.

According to another feature of the present disclosure, a length of a low level voltage of the first clock signal may be shorter than a length of a high level voltage thereof at a period corresponding to a two-horizontal period.

According to another feature of the present disclosure, the Q node controller may include a transistor connected to a low level voltage to always maintain a turn-on state, and the transistor may be connected to the Q node.

In an electroluminescence display apparatus according to an aspect of the present disclosure, the electroluminescence display apparatus includes a display panel including a display area including a plurality of pixel lines and a non-display area including a gate driving circuit supplying a gate signal to the plurality of pixel lines. Also, each of the plurality of pixel lines includes a plurality of pixels, each of the plurality of pixels includes a pixel driving circuit and a light emitting device, each of the pixel driving circuit and the gate driving circuit is implemented with a p-type transistor and an n-type transistor, and the gate driving circuit supplies a gate signal to the n-type transistor of the pixel driving circuit. Accordingly, a stably output may be provided, and the non-display area of the display panel may be reduced.

According to another feature of the present disclosure, the gate driving circuit GD may include a pull-down unit PD controlled by a Q node and a pull-up unit PU controlled by a QB node, and the pull-down unit PD and the pull-up unit PU may be connected to each other to provide a low level voltage VGL or a high level voltage VGH as a gate signal to an n-type transistor of the pixel driving circuit. Also, the pull-down unit PD may be connected to a line supplied with the low level voltage VGL, and the pull-up unit PU may be connected to a line supplied with the high level voltage VGH. Also, the pull-up unit PU may include a first capacitor Cq1 including a first electrode connected to the Q node and a second electrode connected to a node shared by the pull-up unit PU and the pull-down unit PD. Also, the gate driving circuit GD may include a Q node controller CQ controlled by a first clock signal GCLK1 and the low level voltage VGL to transfer a start signal Vst to the Q node, and the Q node controller CQ may include two different types of transistors. Also, the gate driving circuit GD may include a QB node controller CQB controlled by the Q node, and the QB node controller CQB may include two n-type transistors.

According to another feature of the present disclosure, the QB node controller CQB may include a transistor controlled by the Q node and connected to a line supplied with the low level voltage VGL and a transistor including a gate electrode and one electrode each connected to a line supplied with the high level voltage VGH. Also, two transistors may be connected to each other and may share the QB node.

According to the aspects of the present disclosure, by using a gate signal generating circuit which includes a pull-down unit, a pull-up unit, a Q node controller, and a QB node controller, the image quality of a display panel may be enhanced, and power consumption may be reduced.

Moreover, according to the aspects of the present disclosure, by using the gate signal generating circuit including all of an n-type transistor and a p-type transistor, a bezel area of the display panel may decrease, and the reliability of the gate signal generating circuit may be secured.

Moreover, according to the aspects of the present disclosure, by using the gate signal generating circuit including a Q node maintaining unit which maintains a voltage of a Q node, the reliability of a signal output from the gate signal generating circuit may be enhanced.

The effects according to the present disclosure are not limited to the above examples, and other various effects may be included in the specification.

While the present disclosure has been particularly shown and described with reference to exemplary aspects thereof, it will be understood by those of ordinary skill in the art that various changes in form and details may be made therein without departing from the spirit and scope of the present disclosure as defined by the following claims.

What is claimed is:

1. A gate driving circuit comprising:
   a pull-down unit controlled by a Q node to transfer a low level voltage to an output node;
   a pull-up unit controlled by a QB node to transfer a high level voltage to the output node;
   a Q node controller controlled by a first clock signal to transfer a start signal to the Q node; and
   a QB node controller controlled by the Q node to transfer the high level voltage or the low level voltage to the QB node,
   wherein the QB node controller comprises an n-type transistor and a p-type transistor connected to the Q node.

2. The gate driving circuit of claim 1, wherein the pull-down unit and the pull-up unit are connected to the output node,
   the pull-up unit comprises a first capacitor, and
   the first capacitor is connected to the output node and the Q node.

3. The gate driving circuit of claim 1, wherein the start signal has a high level voltage at a period corresponding to a four-horizontal period.

4. The gate driving circuit of claim 3, wherein the first clock signal has a period of the four-horizontal period.

5. The gate driving circuit of claim 4, wherein the first clock signal has a low level pulse which is shorter than half of the period and a high level pulse which is longer than half of the period.

6. The gate driving circuit of claim 4, wherein a high level pulse of the first start signal overlaps a high level pulse and a low level pulse of the first clock signal.

7. The gate driving circuit of claim 4, wherein the first clock signal has a first period which starts before the start signal is input to the Q node controller and a second period which starts after the start signal is input to the Q node controller,
   the first period of the first clock signal starts with a low level voltage of the first clock signal and the start pulse has a low level voltage,
   when the first clock signal has a high level voltage in the first period of the first clock signal, the start pulse is shifted from a low level voltage to a high level voltage, and when the first clock signal has a high level voltage in the first period of the first clock signal, the start signal maintains the high level voltage.

8. The gate driving circuit of claim 7, wherein the second period of the first clock signal starts based on a low level voltage, and the start signal starts based on the high level voltage, and when the first clock signal has the high level voltage in the second period of the first clock signal, the start signal is shifted from a high level voltage to a low level voltage.

9. The gate driving circuit of claim 1, wherein the start signal is an (n−2)th output signal of an (n−2)th gate signal generating circuit, when n is a natural number of 3 or more.

10. A gate driving circuit comprising:
a pull-down unit controlled by a Q node to transfer a low level voltage to an output node;
a pull-up unit controlled by a QB node to transfer a high level voltage to the output node;
a Q node controller controlled by a first clock signal to transfer a start signal to the Q node; and
a QB node controller controlled by the Q node to transfer the high level voltage or the low level voltage to the QB node,
wherein the QB node controller comprises n-type transistors.

11. The gate driving circuit of claim 10, wherein the pull-down unit and the pull-up unit are connected to the output node,
the pull-up unit comprises a first capacitor, and
the first capacitor is connected to the output node and the Q node.

12. The gate driving circuit of claim 10, wherein the start signal has a high level voltage at a period corresponding to a two-horizontal period.

13. The gate driving circuit of claim 12, wherein the first clock signal has a period of the two-horizontal period.

14. The gate driving circuit of claim 13, wherein the first clock signal has a high level pulse corresponding to a shorter period than a one-horizontal period and a low level pulse corresponding to a longer period than the one-horizontal period.

15. The gate driving circuit of claim 13, wherein a high level pulse of the first start signal overlaps a high level pulse and a low level pulse of the first clock signal.

16. The gate driving circuit of claim 13, wherein the first clock signal has a first period which starts before the start signal is input to the Q node controller and a second period which starts after the start signal is input to the Q node controller,
the first period of the first clock signal starts with a low level voltage of the first clock signal and the start pulse has a low level voltage,
when the first clock signal has a low level voltage, the start signal is shifted from a low level voltage to a high level voltage, and
when the first clock signal has a high level voltage in the first period of the first clock signal, the start signal maintains the high level voltage.

17. The gate driving circuit of claim 16, wherein the second period of the first clock signal starts based on a low level voltage, and the start signal starts based on the high level voltage, and
when the first clock signal has the low level voltage in the second period of the first clock signal, the start signal is shifted from a high level voltage to a low level voltage.

18. The gate driving circuit of claim 10, wherein the start signal is an (n−2)th output signal of an (n−2)th gate signal generating circuit, when n is a natural number of 3 or more.

* * * * *